(12) United States Patent
Skorczewski

(10) Patent No.: US 12,595,937 B2
(45) Date of Patent: Apr. 7, 2026

(54) THERMAL MANAGEMENT APPARATUS

(71) Applicant: BAE Systems plc, London (GB)

(72) Inventor: Leon Paul Skorczewski, Warton (GB)

(73) Assignee: BAE Systems plc, London (GB)

( * ) Notice: Subject to any disclaimer, the term of this patent is extended or adjusted under 35 U.S.C. 154(b) by 726 days.

(21) Appl. No.: 17/799,053

(22) PCT Filed: Feb. 10, 2021

(86) PCT No.: PCT/GB2021/050303
§ 371 (c)(1),
(2) Date: Aug. 11, 2022

(87) PCT Pub. No.: WO2021/165646
PCT Pub. Date: Aug. 26, 2021

(65) Prior Publication Data
US 2023/0068896 A1 Mar. 2, 2023

(30) Foreign Application Priority Data

| Feb. 17, 2020 | (EP) | ..................................... 20275042 |
| Feb. 17, 2020 | (GB) | ..................................... 2002135 |

(51) Int. Cl.
| *F25B 5/02* | (2006.01) |
| *F25D 16/00* | (2006.01) |
| *F41H 13/00* | (2006.01) |
| *H10W 40/73* | (2026.01) |
| *B64D 13/06* | (2006.01) |

(52) U.S. Cl.
CPC ................ *F25B 5/02* (2013.01); *F25D 16/00* (2013.01); *F41H 13/005* (2013.01); *H10W*

*40/73* (2026.01); *B64D 2013/0629* (2013.01); *F25B 2400/24* (2013.01)

(58) Field of Classification Search
CPC ........ F25B 5/02; F25D 16/00; F25D 2400/24; F41H 13/005; H01L 23/427; B64D 2013/0629
See application file for complete search history.

(56) References Cited

U.S. PATENT DOCUMENTS

| 6,205,803 B1 | 3/2001 | Scaringe |
| 2009/0260781 A1 | 10/2009 | Ullman |
| 2012/0247117 A1 | 10/2012 | Gagne |
| (Continued) | | |

FOREIGN PATENT DOCUMENTS

| CN | 107152890 A | 9/2017 |
| CN | 209787675 U | 12/2019 |
| (Continued) | | |

OTHER PUBLICATIONS

English translation of Qiu et al. (CN 209787675 U). (Year: 2019).*
(Continued)

*Primary Examiner* — Miguel A Diaz
(74) *Attorney, Agent, or Firm* — Maine Cernota & Curran

(57) ABSTRACT

Provided is a thermal management apparatus for use with a vehicle, the apparatus comprising a plurality of phase change heat exchange units thermally coupled with a vehicle system that requires thermal management, the plurality of phase change heat exchange units operable to remove heat from the vehicle system.

25 Claims, 3 Drawing Sheets

(56)                    References Cited

U.S. PATENT DOCUMENTS

| | | | |
|---|---|---|---|
| 2012/0327596 | A1 | 12/2012 | Anderson-Straley |
| 2015/0184898 | A1* | 7/2015 | Vaisman ................ B64D 13/06<br>62/115 |

FOREIGN PATENT DOCUMENTS

| | | | |
|---|---|---|---|
| DE | 102017219814 | A | 5/2019 |
| DE | 102017212309 | B3 | 9/2019 |
| EP | 2628680 | A1 | 8/2013 |
| EP | 2889551 | A1 | 7/2015 |
| EP | 3279588 | A1 | 2/2018 |
| FR | 3015780 | A3 | 6/2015 |

OTHER PUBLICATIONS

Search Report for Patent Appl. No. GB2002135.8 mail date Jul. 29, 2020, 4 pages.
Extended European Search Report for Patent Appl. No. EP20275042.8 mail date Aug. 21, 2020, 6 pages.
International Search Report and Written Opinion for PCT Appl. No. PCT/GB2021/050303 mail date Apr. 16, 2021, 12 pages.
International Preliminary Report on Patentability for PCT Appl. No. PCT/GB2021/050303 mail date Sep. 1, 2022, 8 pages.

* cited by examiner

THERMAL MANAGEMENT APPARATUS

RELATED APPLICATIONS

This application is a national phase application filed under 35 USC § 371 of PCT Application No. PCT/GB2021/050303 with an international filing date of Feb. 10, 2021, which claims priority of GB Patent Application 2002135.8 filed Feb. 17, 2020 and European patent application 20275042.8 filed Feb. 17, 2020. All of these applications are incorporated herein by reference in their entirety for all purposes.

TECHNICAL FIELD

This disclosure relates to a thermal management apparatus, vehicles incorporating thermal management apparatus, and to methods of thermal management employed in a thermal management apparatus.

BACKGROUND

In aircraft and other vehicles, thermal management is used to ensure vehicle components and systems remain within their desired operating temperature range. Thermal management is particularly important for systems that have high peak energy consumption, and which operate on demand rather than with a steady energy throughput. Such systems have the potential to generate large amounts of heat in a short period of time. That heat can build up more rapidly than can be lost through natural heat dissipation or disposed of via a primary cooling system for the vehicle, such as the cooling system which deals with cooling the vehicle's interior or engines.

For example, laser directed energy weapons (LDEWs) which can be mounted to aircraft or other vehicles have high peak energy consumption and typically need to manage a significant amount of heat generated while the laser is in use over a short time period. Even if integrated into the primary cooling system of the vehicle to which the LDEW is mounted, disposing of excess heat generated during LDEW use can be a limiting factor on LDEW operation. This is particularly the case when the LDEW has different usage patterns according to operational requirements.

In addition, as with all vehicle-mounted systems, there are restrictions on space and weight that can be dedicated to thermal management apparatus. Thus, there is a desire for a small, lightweight and adaptable thermal management apparatus.

SUMMARY

In one aspect there is provided a thermal management apparatus for use with a vehicle. The apparatus comprises a plurality of phase change heat exchange units thermally coupled with a system that requires thermal management, the plurality of phase change heat exchange units operable to remove heat from the vehicle system.

In one example, one or more of the phase change heat exchange units is thermally coupled to a primary cooling system of the vehicle to discharge heat thereto. In one example, each of the phase change heat exchange units is thermally coupled to a primary cooling system of the vehicle. In one example, all of the phase change heat exchange units are thermally coupled to a primary cooling system of the vehicle. In one example this primary cooling system is an engine cooling system of the vehicle, and/or an interior cooling system of the vehicle. The primary cooling system comprises engine cooling and/or interior cooling of the vehicle.

A thermal management apparatus that comprises a plurality of phase change heat exchange units, also known as phase change heat exchangers, that are thermally coupled with a system that requires thermal management takes advantage of the size and weight advantages of individual phase change heat exchange units, enabling flexibility in locating the individual units in a vehicle. Furthermore, flexibility in thermal management is achieved as it is possible to vary the operation of the phase change heat exchange units according to operational requirements of the system to which they are thermally connected. The phase change heat exchange units serve as a buffer between the system to which they are thermally connected and other cooling systems or equipment such as the primary cooling system of a vehicle.

In one example, the thermal management apparatus comprises a manifold, operable to control delivery of heat from the vehicle system to the phase change heat exchange units. In one example, the manifold is operable to direct heat from the vehicle system to a subset of the phase change heat exchange units.

In one example, the manifold is operable to selectively control delivery of heat from the vehicle system to the phase change heat exchange units. In one example, the manifold is operable to selectively control delivery of heat from the vehicle system to individual phase change heat exchange units in the plurality of phase change heat exchange units.

In one example, the thermal management apparatus comprises a controller arranged to control the manifold.

In one example, the controller is arranged to control the manifold to deliver heat from the vehicle system to two or more phase change heat exchange units simultaneously.

In one example, the controller is arranged to control the manifold to deliver heat from the system to all of the phase change heat exchange units simultaneously.

In one example, the controller is arranged to control the manifold to deliver heat from the system to two or more phase change heat exchange units in parallel, for example all of the phase change heat exchange units in parallel.

In one example, the controller is arranged to control the manifold to deliver heat from the system to a first phase change heat exchange unit until that unit's capacity to receive heat is exhausted, then to control the manifold to deliver heat from the system to a second phase change heat exchange unit.

In one example, the controller is arranged to control the manifold to deliver heat from the vehicle system to the phase change heat exchange units in sequence. In one example, the controller is arranged to control the manifold to deliver heat from the vehicle system to the phase change heat exchange units in sequence such that heat from the vehicle system is delivered to one first phase change heat exchange unit until that unit's capacity to receive heat is exhausted, then to the next. In one example, the controller is arranged to control the manifold to deliver heat from the vehicle system to the phase change heat exchange units in sequence such that heat from the vehicle system is delivered to one first phase change heat exchange unit until that unit's capacity to receive heat is exhausted, then to the next until all capacity of all the units to receive heat is exhausted. In one example, the controller is arranged to control the manifold to deliver heat from the vehicle system to phase change heat exchange units cyclically.

In one example, the phase change heat exchange units are operatively coupled to the controller to provide status information on their status. In on example, the phase change heat exchange units are operatively coupled to the controller to provide an indication of their capacity to receive heat.

In one example, the thermal management apparatus comprises one or more temperature sensors arranged to provide temperature information to the controller. In one example, the thermal management apparatus comprises one or more temperature sensors that in use are operatively coupled to the vehicle system.

In one example, the controller comprises a system interface that is in use arranged to interface with the vehicle system that requires thermal management.

In one example the controller is in use arranged to communicate with the vehicle system through the system interface to control operation of the vehicle system.

In one example the controller is arranged to control operation of the vehicle system according to the heat absorbing capacity of the phase change heat exchange units.

In one example the controller is arranged to control operation of the vehicle system according to cool down ratio of the phase change heat exchange units.

In one example the controller is arranged to control operation of the vehicle system according to temperature of the vehicle system.

In one example the controller is arranged to control operation of the vehicle system by inhibiting operation thereof while the temperature of the system is above an operating threshold.

In one example the controller is arranged to control operation of the vehicle system by inhibiting operation thereof while the heat absorbing capacity of the phase change heat exchange units is below a threshold capacity.

In one example, the vehicle system comprises an electronics system. In one example, the vehicle system comprises a defence system. In one example, the vehicle system comprises a laser directed energy weapon.

In one example, one or more of the phase change heat exchange units is thermally coupled to a heat sink on the vehicle. In one example, each of the phase change heat exchange units is thermally coupled to a heat sink on the vehicle. In one example, all of the phase change heat exchange units are thermally coupled to a heat sink on the vehicle.

In one example, one or more of the phase change heat exchange units is thermally coupled to a structural component of the vehicle. In one example, each of the phase change heat exchange units is coupled to a structural component on the vehicle. In one example, all of the phase change heat exchange units are thermally coupled to a structural component on the vehicle. In one example the structural component comprises a chassis of the vehicle. In one example the structural component comprises an airframe of the vehicle. In one example the structural component comprises a fuselage of the vehicle.

In another aspect there is provided a vehicle comprising the thermal management apparatus as set out herein. In one example the vehicle comprises an aircraft. Aircraft are subject to restrictions on available space and weight that can be dedicated to thermal management apparatus, so a thermal management apparatus as described reduces problems of integration with the vehicle while enabling flexibility in operation to match to operational requirements of the system to which the phase change heat exchange units are thermally connected.

In another aspect there is provided a method of thermal management, the method comprising delivering heat from a vehicle system that requires thermal management to a plurality of phase change heat exchange units.

In one example, the method is performed by a thermal management apparatus as set out herein. In one example, the method is performed in a vehicle as set out herein.

In one example, the method comprises operating a manifold to control delivery of heat from the vehicle system to the phase change heat exchange units. In one example, the method comprises operating a manifold to direct heat from the vehicle system to a subset of the phase change heat exchange units.

In one example, the method comprises operating a manifold to selectively control delivery of heat from the vehicle system to the phase change heat exchange units. In one example, the method comprises operating a manifold to selectively control delivery of heat from the vehicle system to individual phase change heat exchange units in the plurality of phase change heat exchange units.

In one example, the method comprises operating a controller to control a manifold to deliver heat from the vehicle system to two or more phase change heat exchange units simultaneously.

In one example, the method comprises operating a controller a manifold to deliver heat from the system to all of the phase change heat exchange units simultaneously.

In one example, the method comprises operating a controller to control a manifold to deliver heat from the system to two or more phase change heat exchange units in parallel, for example all of the phase change heat exchange units in parallel.

In one example, the method comprises operating a controller to control a manifold to deliver heat from the system to a first phase change heat exchange unit until that unit's capacity to receive heat is exhausted, then to control the manifold to deliver heat from the system to a second phase change heat exchange unit.

In one example, the method comprises operating a controller to control a manifold to deliver heat from the vehicle system to the phase change heat exchange units in sequence. In one example, the method comprises operating a controller to control a manifold to deliver heat from the vehicle system to the phase change heat exchange units in sequence such that heat from the vehicle system is delivered to one first phase change heat exchange unit until that unit's capacity to receive heat is exhausted, then to the next. In one example, the method comprises operating a controller to control a manifold to deliver heat from the vehicle system to the phase change heat exchange units in sequence such that heat from the vehicle system is delivered to one first phase change heat exchange unit until that unit's capacity to receive heat is exhausted, then to the next until all capacity of all the units to receive heat is exhausted. In one example, the method comprises operating a controller to control a manifold to deliver heat from the vehicle system to phase change heat exchange units cyclically.

In one example, the method comprises providing status information of the phase change heat exchange units to a controller. In on example, the method comprises providing status information of the phase change heat exchange units to a controller to provide an indication of their capacity to receive heat.

In one example, the method comprises providing temperature information of the vehicle system to a controller. In one example, the method comprises sensing the temperature of the vehicle system.

In one example, the method comprises communicating with the vehicle system through to control operation of the vehicle system.

In one example the method comprises controlling operation of the vehicle system according to the heat absorbing capacity of the phase change heat exchange units.

In one example the method comprises controlling operation of the vehicle system according to cool down ratio of the phase change heat exchange units.

In one example the method comprises controlling operation of the vehicle system according to temperature of the vehicle system.

In one example the method comprises controlling operation of the vehicle system by inhibiting operation thereof while the temperature of the system is above an operating threshold.

In one example the method comprises controlling operation of the vehicle system by inhibiting operation thereof while the heat absorbing capacity of the phase change heat exchange units is below a threshold heat capacity.

BRIEF DESCRIPTION OF THE DRAWINGS

For a better understanding of the invention, and to show how embodiments of the same may be carried into effect, reference will now be made, by way of example only, to the accompanying diagrammatic drawings in which:

FIG. 3 depicts steps in a method according to an example embodiment.

DESCRIPTION OF EXAMPLE EMBODIMENTS

Figure 1:
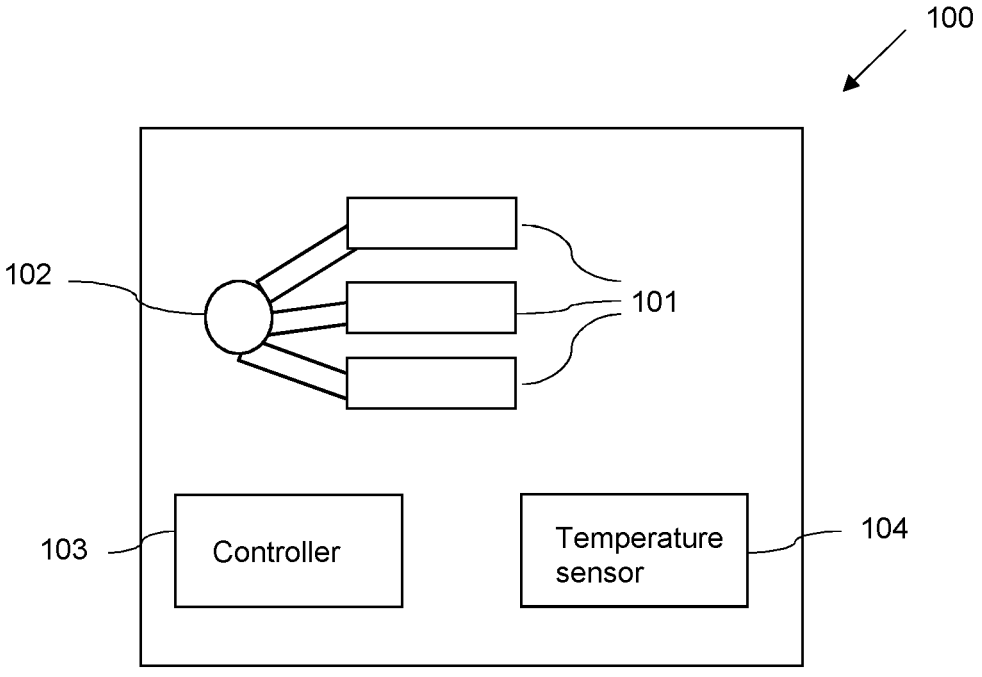
FIG. 1 is an illustration of a thermal management apparatus for use with a vehicle according to an embodiment.

Referring now to FIG. 1, a thermal management apparatus for use with a vehicle is denoted as a whole by the reference numeral 100.

The thermal management apparatus 100 comprises a plurality of phase change heat exchange units 101 that are thermally coupled with a vehicle system that requires thermal management, the plurality of phase change heat exchange units operable to remove heat from the vehicle system. In the embodiment of FIG. 1 three phase change heat exchange units 101 are present.

Figure 2:
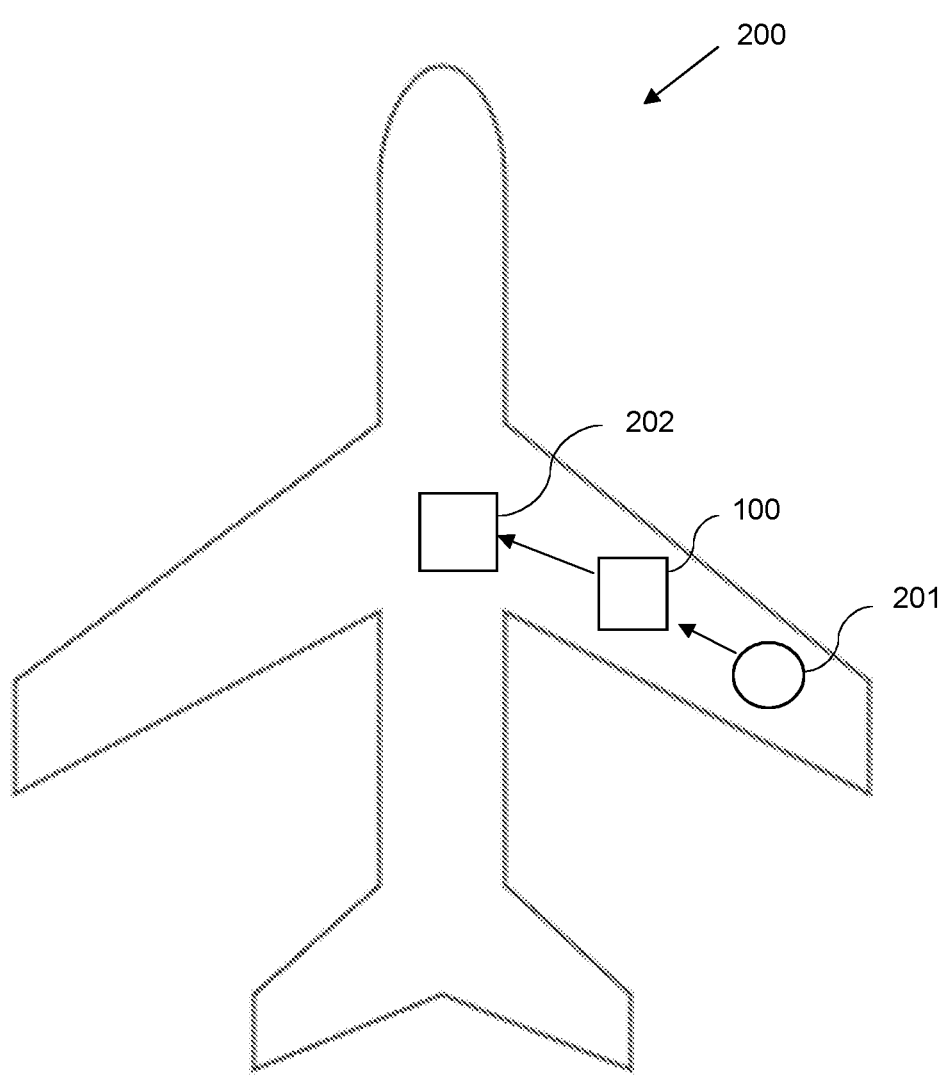
FIG. 2 is an illustration of a vehicle system comprising a thermal management apparatus according to an example embodiment.

FIG. 2 shows a vehicle 200 comprising the thermal management apparatus 100. While the vehicle 200 shown here comprises an aircraft, it would be readily appreciated that the present invention is applicable to other types of vehicles such as ships, land vehicles and so on.

The vehicle 200 comprises various electronics systems that require thermal management to prevent overheating, including a laser directed energy weapon (LDEW) 201. In use, the LDEW 201 generates a significant amount of heat, which poses a limiting factor on LDEW operation due to the amount of time required for the LDEW 201 to cool down before it can be used again.

The phase change heat exchange units 101 are thermally coupled to a primary cooling system 202 of the vehicle 200 to aid removal of heat from the phase change heat exchange units 101. The primary cooling system 202 may include active or forced cooling, alongside passive cooling elements such as specifically provisioned heat sinks (not shown) or by thermal coupling to one or more structural components on the vehicle 200. The primary cooling system 202 comprises engine cooling and/or interior cooling of the vehicle. Here, the primary cooling system includes cooling systems pre-existing in the vehicle, or otherwise arranged for steady state/normal vehicle operations, i.e. not operations of the vehicle system that requires thermal management, in this example the LDEW In FIG. 2, the arrows shown as interconnecting the thermal management apparatus 100, the LDEW 201 and the primary cooling system 202 of the vehicle 200 represent paths for heat transfer. FIG. 2 does not show interconnections for transmission of sensed temperature information, which are described in more detail below.

Referring back to FIG. 1, the thermal management apparatus 100 comprises a manifold 102, operable to control delivery of heat from the LDEW 201 to the phase change heat exchange units 101. The manifold 102 is operable to direct heat from the LDEW 201 to a subset of the phase change heat exchange units 101.

Due to their ability to rapidly absorb the heat load generated by the LDEW 201, the phase change heat exchange unit units 101 provide a compact and effective cooling solution for laser applications. However, typical phase change heat exchange units have a 10:1 cool down ratio; that is, if the heat exchange unit's capacity to absorb heat is exhausted in 10 seconds, 100 seconds is required to re-cool the phase change heat exchange unit 101 so that it is again ready to absorb heat for another 10 seconds.

The manifold 102 is operable to selectively control delivery of heat from the LDEW 201 to individual phase change heat exchange units 101 in the plurality of phase change heat exchange units 101.

The phase change heat exchange units 101 are operatively coupled to the controller 103 to provide information on their status. In particular, the phase change heat exchange units 101 provide, to the controller 103, an indication of their temperature and/or their capacity to receive heat.

The thermal management apparatus 100 comprises a controller 103 arranged to control the manifold 102, based on the phase change heat exchange units' capacity to receive heat. The controller 103 is arranged to control the manifold 102 to deliver heat from the vehicle system to one, two or more phase change heat exchange units 101 simultaneously. Thus, the heat generated by the LDEW 201 can be directed to the phase change heat exchange units 101 which have capacity to receive heat, i.e. are not currently re-cooling.

Depending on operational requirements, the controller 103 may be arranged to control the manifold 102 to deliver heat from the system to a first phase change heat exchange unit 101 until that unit's capacity to receive heat is exhausted, then to control the manifold 102 to deliver heat from the system to a second phase change heat exchange unit 101, the second phase change heat exchange unit capable of receiving heat, and so on, in sequence, cyclically. This method of operation is suitable for enabling a longer burst of operation of the LDEW 201, with corresponding longer cooling delay. Alternatively, to reduce the time between bursts of a shorter duration, the manifold 102 is controllable to deliver heat from the LDEW 201 to the phase change heat exchange units 101 in parallel, so that as much heat as possible is absorbed as quickly as possible after each individual burst of operation of the LDEW 201.

In addition to controlling the manifold 102 to direct heat to the plurality of phase change heat exchange units 101, the controller 103 is arranged to control operation of the LDEW 201 according to the remaining cooling capacity of the phase change heat exchange units 101 and/or the temperature of the LDEW 201. Sensors (not shown) are provided that enable to controller 103 to determine the temperature of the LDEW 201, the phase change heat exchange units 101, and optionally the primary cooling system 202 of the vehicle 200. By monitoring the operation of the LDEW 201 and its temperature, the temperature of the phase change heat exchange units 101 and the performance of the primary cooling system 202 the controller 103 determines the available operating capacity of the LDEW 201. For example, the controller 103 inhibits operation of the LDEW 201 while the temperature of the LDEW 201 is above an operating threshold, and/or while the heat absorbing capacity of the phase change heat exchange units 101 is below a threshold capacity. In this way the LDEW 201 can be maximally operated without overheating.

Figure 3:
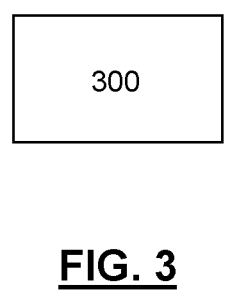

FIG. 3 shows an example of a method of thermal management, applicable to the vehicle 200 of FIG. 2.

At step 300, the method comprises delivering heat from a vehicle system that requires thermal management to a plurality of phase change heat exchange units. The method is performed by a thermal management apparatus on a vehicle as set out herein.

The method comprises operating a manifold to control delivery of heat from the vehicle system to the phase change heat exchange units.

The method comprises providing status information of the phase change heat exchange units to a controller. In particular, the method comprises providing status information of the phase change heat exchange units to a controller to provide an indication of their temperature and their capacity to receive heat.

The method comprises communicating with the vehicle system to control operation of the vehicle system. The method comprises controlling operation of the vehicle system according to the heat absorbing capacity of the phase change heat exchange units, cool down ratio of the phase change heat exchange units, and/or temperature of the vehicle system.

The method comprises controlling operation of the vehicle system by inhibiting operation thereof while the temperature of the system is above an operating threshold and/or while the heat absorbing capacity of the phase change heat exchange units is below an operating threshold.

Where, in the foregoing description, integers or elements are mentioned that have known, obvious, or foreseeable equivalents, then such equivalents are herein incorporated as if individually set forth. Reference should be made to the claims for determining the true scope of the present disclosure, which should be construed so as to encompass any such equivalents. It will also be appreciated by the reader that integers or features of the disclosure that are described as optional do not limit the scope of the independent claims. Moreover, it is to be understood that such optional integers or features, while of possible benefit in some embodiments of the disclosure, may not be desirable, and can therefore be absent, in other embodiments.

What is claimed is:

1. A thermal management apparatus for use with a vehicle, the apparatus comprising:
    a plurality of phase change heat exchange units thermally coupled with a vehicle system that requires thermal management, the plurality of phase change heat exchange units being operable to remove heat from the vehicle system, each of the phase change heat exchange units being configured to absorb heat during a heating period until its heat-absorbing capacity is exhausted, and then to re-cool during a cooling period during which heat is not directed to the phase change heat exchange unit, said cooling period being longer than said heating period; and
    a controller configured to cause a manifold operable under control of the controller to cyclically repeat the following steps:
        A) direct the heat from the vehicle system to a first of the phase change heat exchange units until the heat-absorbing capacity of the first phase change heat exchange unit is exhausted;
        B) direct the heat from the vehicle system to a next one of the phase change heat exchange units until the heat-absorbing capacity of the next one of the phase change heat exchange units is exhausted; and
        C) repeat step B) by directing the heat from the vehicle system to successive next ones of the phase change heat exchange units until the cooling period of the first phase change heat exchange unit has elapsed.

2. The thermal management apparatus of claim 1, wherein one or more of the phase change heat exchange units is thermally coupled to a primary cooling system of the vehicle.

3. The thermal management apparatus of claim 1, wherein the manifold is operable to direct heat from the vehicle system to a subset of the phase change heat exchange units.

4. The thermal management apparatus of claim 1, wherein the manifold is operable to selectively control delivery of heat from the vehicle system to the phase change heat exchange units.

5. The thermal management apparatus of claim 4, wherein the manifold is operable to selectively control delivery of heat from the vehicle system to individual phase change heat exchange units in the plurality of phase change heat exchange units.

6. The thermal management apparatus of claim 1, wherein the controller is arranged to control the manifold to deliver heat from the vehicle system to two or more phase change heat exchange units simultaneously.

7. The thermal management apparatus of claim 1, wherein the controller is arranged to control the manifold to deliver heat from the vehicle system to all of the phase change heat exchange units simultaneously.

8. The thermal management apparatus of claim 1, wherein the controller is arranged to control the manifold to deliver heat from the vehicle system to two or more phase change heat exchange units in parallel.

9. The thermal management apparatus of claim 1, wherein the controller is arranged to control the manifold to deliver heat from the vehicle system to a first phase change heat exchange unit until that unit's capacity to receive heat is exhausted, then to control the manifold to deliver heat from the vehicle system to a second phase change heat exchange unit.

10. The thermal management apparatus of claim 1, wherein the controller is arranged to control the manifold to deliver heat from the vehicle system to the phase change heat exchange units in sequence.

11. The thermal management apparatus of claim 1, wherein the phase change heat exchange units are operatively coupled to the controller to provide status information on their status.

12. The thermal management apparatus of claim 1, wherein the phase change heat exchange units are operatively coupled to the controller to provide an indication of their capacity to receive heat.

13. The thermal management apparatus of claim 1, further comprising one or more temperature sensors arranged to provide temperature information to the controller from at least one of the phase change heat exchange units and/or the vehicle system.

14. The thermal management apparatus of claim 1, wherein the controller comprises a system interface that is, in use, arranged to interface with the vehicle system that requires thermal management.

15. The thermal management apparatus of claim 14, wherein the controller is, in use, arranged to communicate with the vehicle system through the system interface to control an operation of the vehicle system.

16. The thermal management apparatus of claim 1, wherein the controller is arranged to control an operation of the vehicle system according to at least one of: the heat absorbing capacity of the phase change heat exchange units, a cool down ratio of the phase change heat exchange units, and a temperature of the vehicle system.

17. The thermal management apparatus of claim 1, wherein the controller is arranged to control an operation of the vehicle system by inhibiting the operation thereof while the temperature of the vehicle system is above an operating threshold.

18. The thermal management apparatus of claim 1, wherein the controller is arranged to control an operation of the vehicle system by inhibiting the operation thereof while the heat absorbing capacity of the phase change heat exchange units is below a threshold capacity.

19. The thermal management apparatus of claim 1, wherein the vehicle system comprises a laser directed energy weapon.

20. The thermal management apparatus of claim 1, wherein one or more of the phase change heat exchange units is thermally coupled to a heat sink on the vehicle.

21. The thermal management apparatus of claim 1, wherein one or more of the phase change heat exchange units is thermally coupled to a structural component of the vehicle.

22. A vehicle comprising the thermal management apparatus of claim 1.

23. A method of thermal management of a vehicle system, the method comprising:

providing:

a plurality of phase change heat exchange units thermally coupled with the vehicle system, each of the phase change heat exchange units being configured to absorb heat during a heating period until its heat-absorbing capacity is exhausted, and then to re-cool during a cooling period during which heat is not directed to the phase change heat exchange unit, said cooling period being longer than said heating period;

a controller operatively coupled to the phase change heat exchange units; and a manifold operable under control of the controller; and causing the manifold to cyclically repeat the following steps:

A) direct the heat from the vehicle system to a first of the phase change heat exchange units until the heat-absorbing capacity of the first phase change heat exchange units is exhausted;

B) direct the heat from the vehicle system to a next one of the phase change heat exchange units until the heat-absorbing capacity of the next one of the phase change heat exchange units is exhausted; and C) repeat step B) by directing the heat from the vehicle system to successive next ones of the phase change heat exchange units until the cooling period of the first phase change heat exchange unit has elapsed.

24. The method of claim 23, wherein the method further comprises providing to the controller by the heat exchange units an indication of their status.

25. The method of claim 23, wherein the method further comprises providing to the controller by the heat exchange units an indication of their capacity to receive heat.

* * * * *